(12) United States Patent
Bell et al.

(10) Patent No.: US 6,606,738 B1
(45) Date of Patent: Aug. 12, 2003

(54) ANALYTICAL MODEL FOR PREDICTING THE OPERATING PROCESS WINDOW FOR LITHOGRAPHIC PATTERNING TECHNIQUES BASED ON PHOTORESIST TRIM TECHNOLOGY

(75) Inventors: Scott Bell, San Jose, CA (US); Marina Plat, San Jose, CA (US); Amada Wilkison, San Jose, CA (US); Chih-Yuh Yang, San Jose, CA (US)

(73) Assignee: Advanced Micro Device, Inc., Sunnyvale, CA (US)

( * ) Notice: Subject to any disclaimer, the term of this patent is extended or adjusted under 35 U.S.C. 154(b) by 203 days.

(21) Appl. No.: 09/822,993

(22) Filed: Mar. 30, 2001

(51) Int. Cl.$^7$ .............................................. G06F 17/50
(52) U.S. Cl. ................. 716/21; 716/19; 716/1
(58) Field of Search .............. 438/689; 716/1, 716/21, 19

(56) References Cited

U.S. PATENT DOCUMENTS

| | | | |
|---|---|---|---|
| 5,256,505 A | * 10/1993 | Chen et al. | 430/5 |
| 5,340,700 A | * 8/1994 | Chen et al. | 430/312 |
| 6,121,155 A | * 9/2000 | Yang et al. | 438/725 |

* cited by examiner

Primary Examiner—Vuthe Siek
Assistant Examiner—Brandon Bowers

(57) ABSTRACT

In the present method of trimming photoresist to form a mask for a layer of a semiconductor device, which layer may include polysilicon and/or nitride, the method is practiced substantially in accordance with:

$$w_{min} = (h_0 - R_v t_{max})/AR_{max}$$

where
$w_1$ = minimum width of trimmed photoresist;
$h_0$ = height of photoresist prior to trim;
$R_v$ = resist vertical etch rate;
$t_{max}$ = maximum etch time to reach resist vertical etch limit; $AR_{max}$ = maximum allowable aspect ratio of trimmed photoresist.

The present invention is further a method of trimming photoresist to form a mask for a layer of a semiconductor device, which layer may include polysilicon and/or nitride, and which method is practiced substantially in accordance with:

$$w_0 = (h_0 - R_v t_{max})/AR_{max} + R_h t_{max}$$

where
$w_0$ = width of photoresist prior to trim;
$h_0$ = height of photoresist prior to trim;
$R_v$ = resist vertical etch rate;
$t_{max}$ = maximum etch time to reach resist vertical etch limit;
$AR_{max}$ = maximum allowable aspect ratio of trimmed photoresist;
$R_h$ = horizontal resist etch rate.

12 Claims, 2 Drawing Sheets

ANALYTICAL MODEL FOR PREDICTING THE OPERATING PROCESS WINDOW FOR LITHOGRAPHIC PATTERNING TECHNIQUES BASED ON PHOTORESIST TRIM TECHNOLOGY

BACKGROUND OF THE INVENTION

1. Field of the Invention

This invention relates generally to methods of fabricating semiconductor devices, and more particularly, to a trim etch process that trims or reduces the critical dimension (CD) of the gate pattern in a resist mask.

2. Discussion of the Related Art

The trend toward ultra large-scale integration (ULSI) in semiconductor technology, directed toward an effort to build integrated circuits with more and faster semiconductor devices, has a result in continued shrinking of critical dimensions of the devices. For example, in circuits having field—effect transistors, a very important process step is the formation of the gate for each of the transistors, and in particular the width of the gate. In many applications, the switching speed and size of the transistor are functions of the width of the transistor gate. A narrower gate tends to produce a higher performance, i.e. a faster transistor which is also smaller in size, i.e., narrower in width.

The limitations of conventional lithographic techniques, which are used to pattern the gate during device fabrication, are quickly being realized Accordingly, there is a continuing need for more efficient and effective fabrication processes for forming transistor gates that are smaller and/or exhibit higher performance.

One technique for achieving narrower gate width is that of trim etch, undertaken on a resist line 10 on a substrate 12 (FIG. 1), which resist line 10 is used to form the gate. Using conventional lithographic techniques, the resist line 10 has a width, called the Develop Inspect Critical Dimension (DICD), that is wider than the desired gate to be formed. For example, a typical deep-UV stepper in certain embodiments provides reliable resolution capabilities down to 0.25 microns. To provide for gate width that is less than 0.25 microns, the 0.25 micron wide resist line is isotropically etched in a controlled manner in a high-density plasma etching system, to provide etching in horizontal directions $A_1$, $A_2$ along with etching in the vertical direction B, until a narrower final line, having a final critical dimension (FICD), remains.

Since a resist line with a relatively large DICD requires a relatively long trim etch time to achieve a given FICD, a significant amount of the resist is normally etched away in a vertical direction B, resulting in a substantial weakening and thinning of the photoresist 10. This significant reduction of the vertical dimension or thickness of the photoresist 10 from its untrimmed vertical dimension can promote discontinuity thereof, resulting in the photoresist 10 being incapable of providing effective masking in the fabrication of the gate. In the case of a relatively small DICD, a resist with a small vertical resist dimension is required in order to prevent pattern collapse and/or bending caused by capillary actions during the lithography process, due to an undesirably high aspect ratio (AR), i.e., height/width ratio, of the partially etched resist structure.

A trim etch process is required to maintain a balance between vertical resist etch or erosion and horizontal resist trim. In an optimum process, given resist thickness and type, in order to minimize FICD, there is an optimum DICD which will enable the smallest FICD to be obtained. This is given by the intersection of the aspect ratio and erosion limits. However, for the same resist thickness and type, and DICD, if the ratio $R_v/R_h$ ($R_v$=vertical resist erosion rate, $R_h$=horizontal resist trim rate=sum of trim rates in $A_1$, $A_2$ directions) is lower than optimum, a feature trimmed with this process will fail earlier (i.e., at a larger FICD) than the optimum process, due to pattern collapse or bending. Furthermore, again for the same resist thickness and type, and DICD, if the ratio $R_v/R_h$ is higher than optimum, a feature trimmed with this process will again fail earlier (i.e., at a larger FICD) than the optimum process, in this case due to excessive resist erosion, i.e., insufficient resist is left to mask the remainder of the polysilicon etch process.

Therefore, what is needed it is a method for modeling, predicting and defining a trim etch process so as to overcome the above problems.

SUMMARY OF THE INVENTION

The present invention is a method of trimming photoresist to form a mask for a layer of a semiconductor device, which layer may include polysilicon and/or nitride. The method is practiced substantially in accordance with:

$$w_{min} = (h_0 - R_v t_{max})/AR_{max}$$

where $w_{min}$=minimum width of trimmed photoresist;

$h_0$=height of photoresist prior to trim;

$R_v$=resist vertical etch rate;

$t_{max}$=maximum etch time to reach resist vertical etch limit;

$AR_{max}$=maximum allowable aspect ratio.

The present invention is further a method of trimming photoresist to form a mask for a layer of a semiconductor device, which layer may include polysilicon and/or nitride. The method is practiced substantially in accordance with:

$$w_0 = (h_0 - R_v t_{max})/AR_{max} + R_h t_{max}$$

where $w_0$=width of photoresist prior to trim;

$h_0$=height of photoresist prior to trim;

$R_v$=resist vertical etch rate;

$t_{max}$=maximum etch time to reach resist vertical etch limit;

$AR_{max}$=maximum allowable aspect ratio;

$R_h$=horizontal resist etch rate.

The present invention is better understood upon consideration of the detailed description below, in conjunction with the accompanying drawings. As will become readily apparent to those skilled in the art from the following description, there is shown and described an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

DETAILED DESCRIPTION

Reference is now made in detail to a specific embodiment of the present invention which illustrates the best mode presently contemplated by the inventors for practicing the invention.

Figure 1:
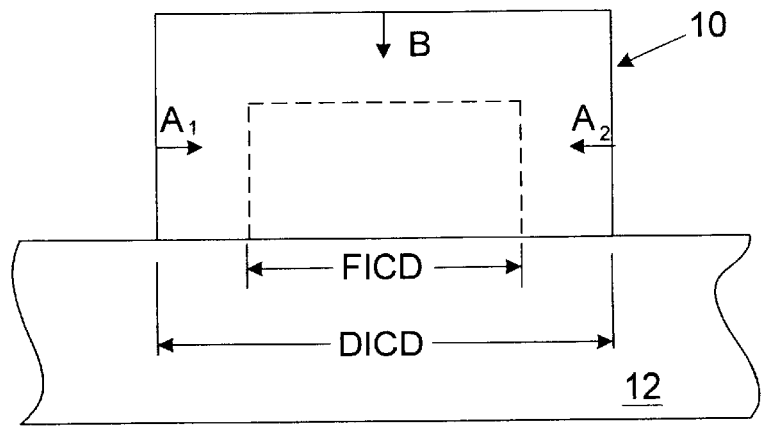
FIG. 1 is a sectional view of a semiconductor structure showing trim of photoresist in accordance with the prior art.
Figure 2:
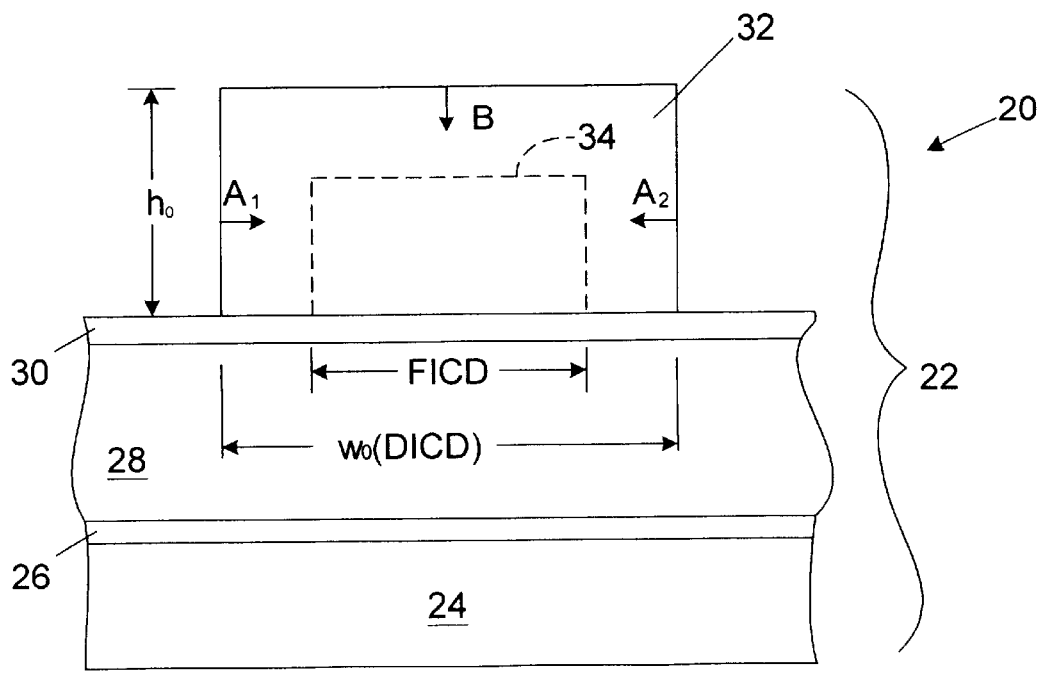
FIG. 2 is a sectional view of a semiconductor device showing a step in the present inventive process.
Figure 3:
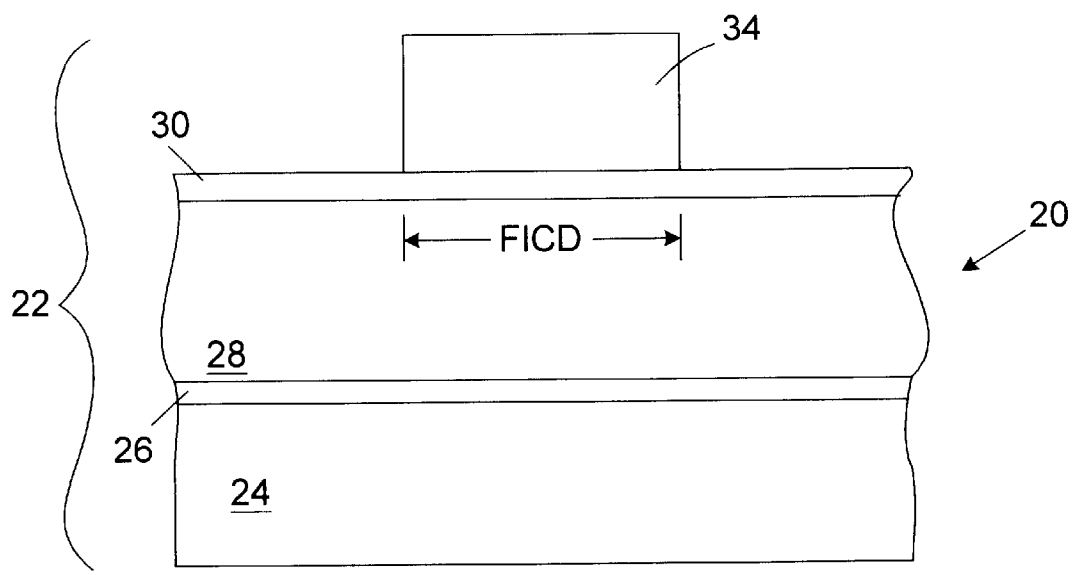
FIG. 3 is a sectional view of the semiconductor device of FIG. 2 showing a further step in the inventive process.

FIGS. 2 and 3 illustrate a portion of a semiconductor device 20 being fabricated on a semiconductor wafer. The portion 20 includes a wafer stack 22 having a plurality of layers including a substrate 24, a thin oxide layer 26, and a gate conductive layer 28. As depicted, there is provided on the conductive layer 28 a bottom anti-reflective coating (BARC) 30 of for example silicon nitride ($Si_3N_4$). A resist mask 32 is provided on the BARC 30. By way of example, resist mask 32 is a conventional deep-UV resist material applied to and formed on the BARC 30 using conventional techniques.

The portion 20 is placed within a plasma reactor chamber in which etching processes are conducted In conventional practice, resist mask 32, formed by conventional lithography techniques, has an initial line width $w_0$, called the Develop Inspect Critical Dimension (DICD) that is wider than the desired gate to be formed. A trim etch process is used to reduce the line width to a Final Critical Dimension (FICD) to match the desired gate width. The trim etch process includes isotropically etching away a portion of the resist line 32 to produce a final resist line 34 that has a final width that is approximately equal to the desired gate width.

As is well known, trim etching of the resist 32 takes place in both the horizontal ($A_1$, $A_2$) and the vertical (B) directions. Thus, as shown in FIG. 2, a resist line 32 which has an initial width of $w_0$ and an initial height of $h_0$ will be etched vertically at a resist vertical etch rate $R_v$, and horizontally at a horizontal resist etch rate $R_h$, which is the sum of the etch rates on the sides of the resist line 32.

As pointed out above, if the ratio $R_v/R_h$ is too low, resulting in a high aspect ratio, i.e., height/width ratio of the resist line, the resist can bend and/or collapse. In contrast, if the ratio $R_v/R_h$ is too high, the trim process may fail because insufficient resist is left to mask the remainder of the polysilicon etch process.

In order to avoid the above—cited problems, two basic parameters are defined.

$AR_{max}$=maximum allowable aspect ratio of trimmed photoresist.

$t_{max}$=maximum etch time to reach resist vertical etch limit.

Adopting these limits in the trim etch process avoids the problems set forth above, it being understood that neither $AR_{max}$ nor $t_{max}$ is to be exceeded.

A summary of equations is as follows:

t=time (sec);
w(t)=width of photoresist at time t (nm);
h(t)=height of photoresist at time t (nm);
AR(t)=aspect ratio (height/width) of photoresist at time t;
$h_0$=initial photoresist thickness or height prior to trim (nm);
$w_0$=width of photoresist prior to trim (DICD) (nm);
$R_h$=resist horizontal etch rate (nm/sec);
$R_v$=resist vertical etch rate (nm/sec);
$AR_{max}$=maximum allowable aspect ratio;
$h_{min}$=minimum post-trim photoresist thickness (height) allowed (nm);
$w_{min1}$=minimum width of photoresist (FICD) at maximum AR (nm);
$w_{min2}$=minimum width of photoresist (FICD) at resist vertical erosion or etch limit (nm);
$w_{min}$=minimum obtainable width of trimmed photoresist (nm);
$t_{max}$=time to reach resist vertical erosion or etch limit (sec).

The width of the resist as a function of time is given as $w(t)=w_0-R_h t$;

the height of the resist as a function of time is given as $h(t)=h_0-R_v t$;

the aspect ratio of the resist as a function of time is given as $AR(t)=h(t)/w(t)$.

The aspect ratio limit is as follows:

| FICD: | $w_{min1} = h(t)/AR_{max}$ |
|---|---|
| | $w_{min1} = (h_0 - R_v t)/AR_{max}$ |
| DICD: | $w_0 = h(t)/AR_{max} + R_h t$ |
| | $w_0 = (h_0 - R_v t)/AR_{max} + R_h t$ |

The resist erosion limit is as follows:

| Maximum etching time: | $t_{max} = (h_0 - h_{min})/R_v$ |
|---|---|
| FICD: | $w_{min2} = w_0 - R_h t_{max}$ |
| | $w_{min2} = w_0 - R_h(h_0 - h_{min})/R_v$ |

The intersection of the aspect ratio limit and the resist erosion limit are derived from the above:

| DICD: | $w_0 = w_{min} + R_h t_{max}$ |
|---|---|
| | $w_0 = (h_0 - R_v t_{max})/AR_{max} + R_h t_{max}$ |
| FICD: | $w_{min} = h_{min}/AR_{max}$ |
| | $w_{min} = (h_0 - R_v t_{max})/AR_{max}$ |

Figure 4:
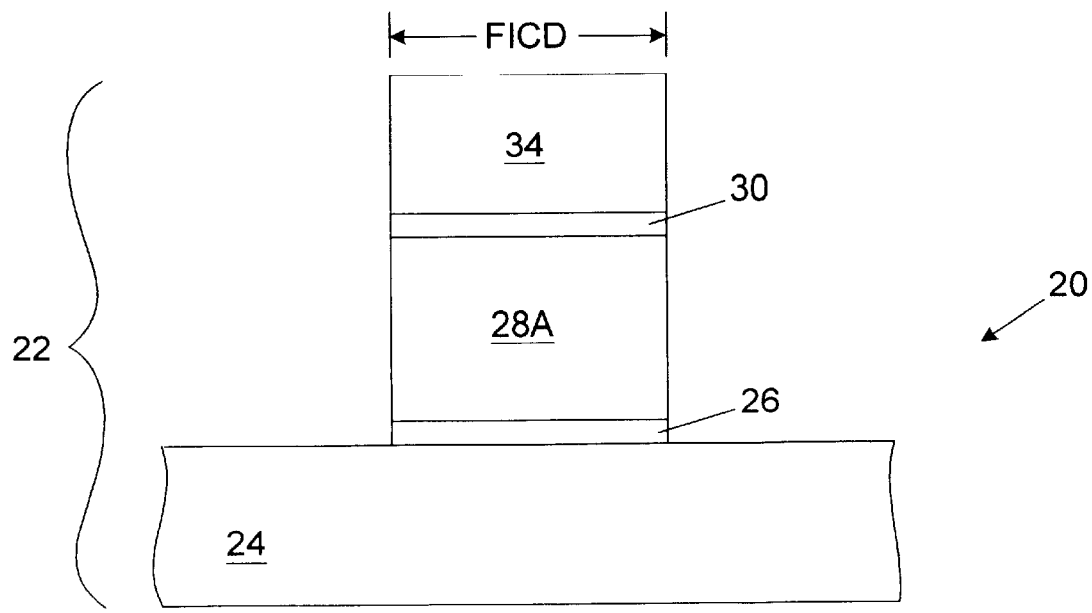
FIG. 4 is a sectional view of the semiconductor device of FIGS. 2 and 3 showing a still further step in the inventive process.

FIG. 4 illustrates portion 20 following an etching process in which the pattern of the final resist line 34 is essentially transferred to BARC 30 by anisotropically etching away exposed portions of BARC 30, and further illustrates gate conductive layer etching, removing exposed portions of the gate conductive layer 28 and oxide layer 26. The result of this process is that gate 28A is formed having substantially the same width as the final resist line 34. The process then continues as is well known to form completed transistors in subsequent fabrication steps.

This process model can be used to model, predict, and define the DICD, trim process, and resist thickness combination needed to produce polysilicon patterns of very small dimensions, particularly below 100 nm. The process model aids in the selection of the lithography/trim etch process conditions needed to avoid photoresist pattern collapse and/or excess of resist vertical erosion.

The foregoing description of the embodiment of the invention has been presented for purposes of illustration and description. It is not intended to be exhaustive or to limit the invention to the precise form disclosed. Other modifications or variations are possible in light of the above teachings.

The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of trimming photoresist to form a mask for a layer of a semiconductor device comprising trimming a photoresist element substantially in accordance with:

$$w_{min}=(h_0-R_v t_{max})/AR_{max}$$

where $w_{min}$=minimum width of trimmed photoresist;

$h_0$=height of photoresist prior to trim;

$R_v$=resist vertical etch rate;

$t_{max}$=maximum etch time to reach resist vertical etch limit;

$AR_{max}$=maximum allowable aspect ratio.

2. The method of claim 1 and further comprising the step of providing that the layer comprises a polysilicon layer.

3. The method of claim 1 and further comprising the step of providing that the layer comprises a nitride layer.

4. A method of trimming photoresist to form a mask for a layer of a semiconductor device comprising trimming a photoresist element substantially in accordance with:

$$w_0=(h_0-R_v t_{max})AR_{max}+R_h t_{max}$$

where $w_0$=width of photoresist prior to trim;

$h_0$=height of photoresist prior to trim;

$R_v$=resist vertical etch rate;

$t_{max}$=maximum etch time to reach resist vertical etch limit;

$AR_{max}$=maximum allowable aspect ratio;

$R_h$=horizontal resist etch rate.

5. The method of claim 4 and further comprising the step of providing that the layer comprises a polysilicon layer.

6. The method of claim 4 and further comprising the step of providing that the layer comprises a nitride layer.

7. A method of trimming photoresist to form a mask for a layer of a semiconductor device comprising trimming a photoresist element substantially in accordance with:

$$w_{min1}=(h_0-R_v t)/AR_{max}$$

where $w_{min1}$=minimum width of photoresist (FICD) at maximum AR (nm);

$h_0$=initial photoresist thickness or height prior to trim;

$R_v$=resist vertical etch rate (nm/sec);

$t$=time;

$AR_{max}$=maximum allowable aspect ratio.

8. The method of claim 7 and further comprising the step of providing that the layer comprises a polysilicon layer.

9. The method of claim 7 and further comprising the step of providing that the layer comprises a nitride layer.

10. A method of trimming photoresist to form a mask for a layer of a semiconductor device comprising trimming a photoresist element substantially in accordance with:

$$w_{min2}=w_0-R_h(h_0-h_{min})/R_v$$

where $w_{min2}$=minimum width of photoresist (FICD) at resist vertical erosion or etch limit (nm);

$w_0$=width of photoresist prior to trim (DICD) (nm);

$R_h$=resist horizontal etch rate (nm/sec);

$h_0$=initial photoresist thickness or height prior to trim (nm);

$h_{min}$=minimum post-trim photoresist thickness (height) allowed (nm);

$R_v$=resist vertical etch rate (nm/sec).

11. The method of claim 10 and further comprising the step of providing that the layer comprises a polysilicon layer.

12. The method of claim 10 and further comprising the step of providing that the layer comprises a nitride layer.

* * * * *